United States Patent
Pandey et al.

(10) Patent No.: US 11,049,955 B2
(45) Date of Patent: Jun. 29, 2021

(54) EPI SEMICONDUCTOR MATERIAL STRUCTURES IN SOURCE/DRAIN REGIONS OF A TRANSISTOR DEVICE FORMED ON AN SOI SUBSTRATE

(71) Applicant: GLOBALFOUNDRIES U.S. Inc., Santa Clara, CA (US)

(72) Inventors: Shesh Mani Pandey, Saratoga Springs, NY (US); Jagar Singh, Clifton Park, NY (US); Judson R. Holt, Wappingers Falls, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/727,453

(22) Filed: Dec. 26, 2019

(65) Prior Publication Data

US 2020/0135895 A1 Apr. 30, 2020

Related U.S. Application Data

(62) Division of application No. 15/711,410, filed on Sep. 21, 2017, now abandoned.

(51) Int. Cl.
| | |
|---|---|
| *H01L 29/66* | (2006.01) |
| *H01L 29/165* | (2006.01) |
| *H01L 29/78* | (2006.01) |
| *H01L 29/06* | (2006.01) |
| *H01L 29/417* | (2006.01) |

(52) U.S. Cl.
CPC .... *H01L 29/66636* (2013.01); *H01L 29/0653* (2013.01); *H01L 29/165* (2013.01); *H01L 29/41725* (2013.01); *H01L 29/7848* (2013.01)

(58) Field of Classification Search
CPC ......... H01L 29/66636; H01L 29/41725; H01L 29/0653
See application file for complete search history.

(56) References Cited

U.S. PATENT DOCUMENTS

| | | | |
|---|---|---|---|
| 5,461,250 A | 10/1995 | Burghartz et al. | |
| 7,268,024 B2 | 9/2007 | Yeo et al. | |
| 8,395,217 B1* | 3/2013 | Cheng | H01L 21/84 257/350 |
| 2010/0258868 A1 | 10/2010 | Yin et al. | |
| 2011/0024840 A1* | 2/2011 | Khater | H01L 29/66628 257/347 |
| 2011/0241084 A1* | 10/2011 | Wu | H01L 29/66795 257/288 |
| 2012/0292700 A1* | 11/2012 | Khakifirooz | H01L 21/84 257/347 |

(Continued)

*Primary Examiner* — Marcos D. Pizarro
*Assistant Examiner* — Antonio B Crite
(74) *Attorney, Agent, or Firm* — Francois Pagette; Hoffman Warnick LLC (57) ABSTRACT

One illustrative device disclosed herein includes a transistor formed above a semiconductor-on-insulator (SOI) substrate, wherein the transistor comprises a gate structure, a sidewall spacer and source/drain regions, openings formed in the active layer in the source/drain regions adjacent the sidewall spacer, recesses formed in a buried insulation layer of the SOI substrate in the source/drain regions of the transistor, wherein the recesses extend laterally under a portion of the active layer, and an epi semiconductor material positioned in at least the recesses in the buried insulation layer.

13 Claims, 6 Drawing Sheets

(56) References Cited

U.S. PATENT DOCUMENTS

2014/0141589 A1\* 5/2014 Shin ................ H01L 21/823807
                                                                           438/306
2014/0346600 A1\* 11/2014 Cheng ................ H01L 29/7849
                                                                           257/347
2014/0370668 A1    12/2014 Niebojewski et al.

\* cited by examiner

EPI SEMICONDUCTOR MATERIAL STRUCTURES IN SOURCE/DRAIN REGIONS OF A TRANSISTOR DEVICE FORMED ON AN SOI SUBSTRATE

BACKGROUND OF THE INVENTION

1. Field of the Invention

The present disclosure generally relates to the fabrication of integrated circuits, and, more particularly, to various novel epitaxial (epi) semiconductor material structures in the source/drain regions of a transistor device formed on an SOI (Semiconductor-On-Insulator) substrate.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the source region and the drain region and current flows from the source region to the drain region.

Fully depleted transistor devices are typically formed on a relative thin active layer of a semiconductor-on-insulator (SOI) substrate. The SOI substrate includes a bulk semiconductor layer, a buried insulation layer positioned on the bulk semiconductor layer and an active semiconductor layer positioned on the buried insulation layer. In many situations, an epitaxial semiconductor material is grown on the active layer in the source/drain regions of the transistor device by performing an epitaxial growth process for a variety of reasons. For example, the epi semiconductor material may be formed in such a manner that it imparts a desired stress on the channel region of the transistor, i.e., a compressive stress for a PFET device or a tensile stress for an NFET device. In some applications, the exposed portions of the active layer in the source/drain regions may be slightly etched to form a recess in the active layer prior to forming the epi semiconductor material. However, this recess in the active layer does not typically expose the underlying buried insulation layer. The recess is formed in the active layer prior to forming the epi semiconductor material so that more of the stressed epi semiconductor material may be positioned adjacent the channel region of the transistor. However, in some situations, due to processing operations performed after the formation of the stressed epi semiconductor material, the stressed epi semiconductor material may relax, thereby reducing the amount of desirable stress imparted to the channel region of the transistor and reducing the performance characteristics of the transistor.

The present disclosure is directed to various novel epi semiconductor material structures in the source/drain regions of a transistor device formed on an SOI substrate that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to novel epi semiconductor material structures in the source/drain regions of a transistor device formed on an SOI substrate. One illustrative device disclosed herein includes a transistor formed above a semiconductor-on-insulator (SOI) substrate, wherein the transistor comprises a gate structure, a sidewall spacer and source/drain regions, openings formed in the active layer in the source/drain regions adjacent the sidewall spacer, recesses formed in a buried insulation layer of the SOI substrate in the source/drain regions of the transistor, wherein the recesses extend laterally under a portion of the active layer, and an epi semiconductor material positioned in at least the recesses in the buried insulation layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods disclosed herein for forming epi semiconductor material in the source/drain regions of a transistor device that is formed on an SOI (Semiconductor-On-Insulator) substrate and associated device structures. As will be readily apparent to those skilled in the art upon a complete reading of the present application, the present method is applicable to a variety of products, including, but not limited to, logic products, memory products, etc. For example, the method disclosed herein may be employed on any type of application in any type of IC product, circuit or device wherein epi semiconductor material is formed in the source/drain regions of a transistor device. In the example depicted herein, the transistor devices are planar transistor devices. However, after a complete reading of the present application, those skilled in the art will appreciate that the methods disclosed herein may be employed with other types of transistor devices, such as FinFET devices. Thus, the presently disclosed inventions should not be considered to be limited to any particular type of IC product or any particular form of transistor devices. Additionally, various doped regions, e.g., halo implant regions, doped source/drain regions, well regions and the like, and certain material layers, e.g., etch stop contact layers, are not depicted in the attached drawings. With reference to the attached figures, various illustrative embodiments of the methods and devices disclosed herein will now be described in more detail.

An illustrative integrated circuit (IC) product 10 disclosed herein will be formed in and above a semiconductor-on-insulator (SOI) substrate 12. The SOI substrate 12 includes a bulk semiconductor layer 12A, a buried insulation layer 12B and an active semiconductor layer 12C. A plurality of transistor devices 14A-C (collectively referred to using the reference numeral 14) will be formed in and above the active layer 12C. The active layer 12C and/or the bulk semiconductor layer 12A may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. The buried insulation layer 12B may be comprised of a variety of different insulating materials, e.g., silicon dioxide.

The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 1:
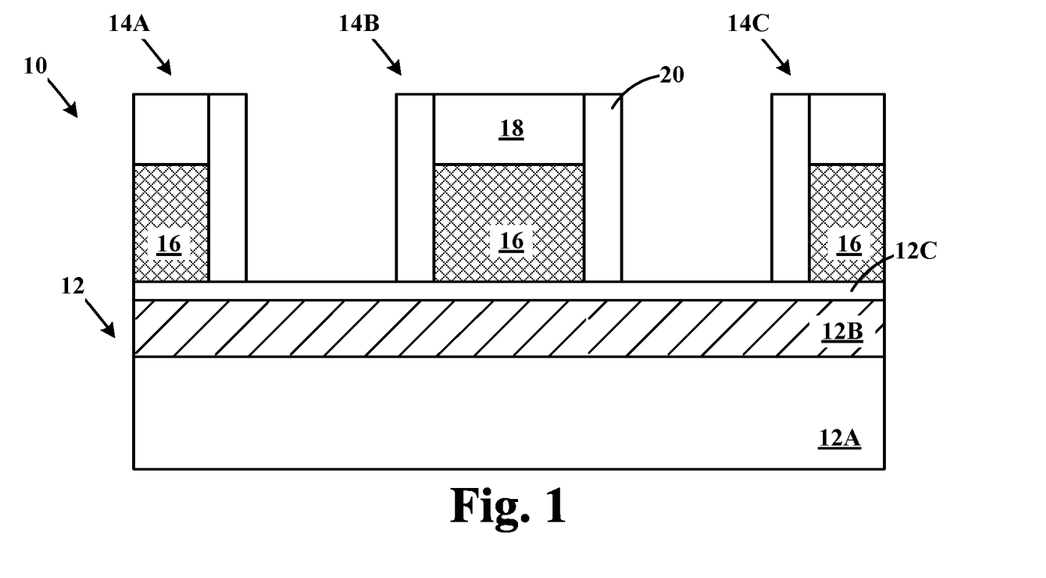
FIG. 1-12 depict various novel methods disclosed herein for forming epi semiconductor material in the source/drain regions of a transistor device that is formed on an SOI substrate and associated device structures.

FIG. 1 depicts the product 10 after the gates for the transistor devices 14 have been formed above the substrate 12. The transistors 14 may be NFET devices, PFET devices, or a combination of NFET and PFET devices. In one illustrative embodiment, the transistor devices 14 may all be PFET devices. In the example depicted herein, an epi semiconductor material will be formed in the source/drain regions of the transistor 14B. The gates of the transistors 14 generally comprise a simplistically depicted and representative gate structure 16, a gate cap 18 and a simplistically depicted sidewall spacer 20. The gate structure 16 typically includes a gate insulation layer (not separately shown) and one or more conductive material layers (not separately shown) that function as the conductive gate electrode for the transistor device 14. The gate structures 16 may be manufactured using well-known gate-first or replacement gate manufacturing techniques. The gate insulation layer of the gate structures 16 may be comprised of a variety of different materials, e.g., silicon dioxide, a high-k (k value greater than 10) layer of insulating material, such as, for example, hafnium oxide, etc. The gate electrode of the gate structures 16 may be comprised of a variety of materials, e.g., amorphous silicon, polysilicon, one or more layers of metal, etc.

With continuing reference to FIG. 1, the spacers 20 for the transistors 14 were formed by performing the following process operations. First, a conformal layer of spacer material (not shown), e.g., silicon nitride, SiNC, SiN, SiCO and SiNOC, was formed on the product 10 by performing a conformal deposition process, e.g., a conformal ALD deposition process. Next, an anisotropic etching process was performed to remove horizontally positioned portions of the layer of spacer material so as to form the simplistically depicted spacers 20 on the transistors 14. The spacers 20 may be formed to any desired thickness (at the base of the spacer 20).

Figure 2:
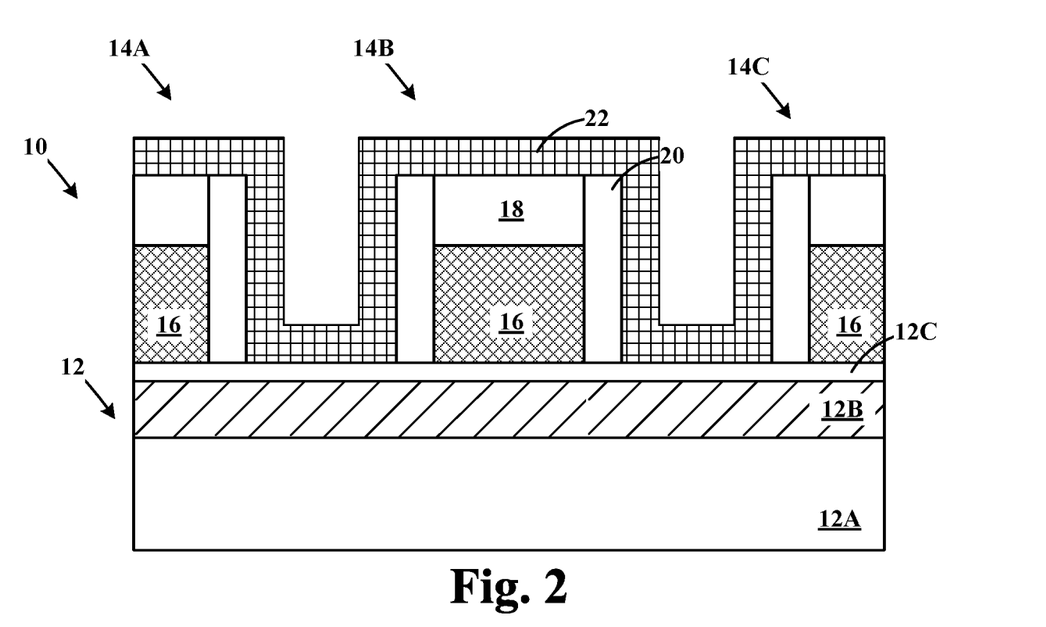

FIG. 2 depicts the product 10 after a conformal layer of sacrificial spacer material 22 (e.g., silicon nitride, SiNC, SiN, SiCO and SiNOC) was formed across all three transistors 14. The conformal layer of sacrificial spacer material 22 should be made of a material that may be selectively etched relative to the material of the spacers 20. The layer of sacrificial spacer material 22 may be formed to any desired thickness.

Figure 3:
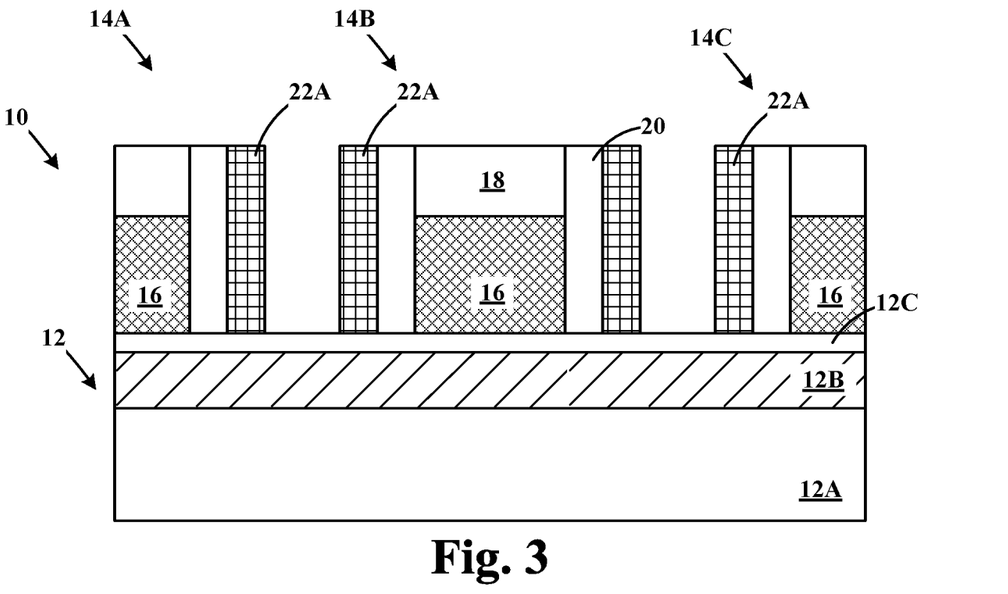

FIG. 3 depicts the product 10 after another anisotropic etching process was performed to remove horizontally positioned portions of the layer of sacrificial spacer material 22 so as to form the simplistically depicted sacrificial spacers 22A adjacent the spacers 20. The sacrificial spacers 22A may be formed to any desired thickness (at the base of the sacrificial spacers 22A). As depicted, portions of the active layer 12C are exposed between the sacrificial spacers 22A.

Figure 4:
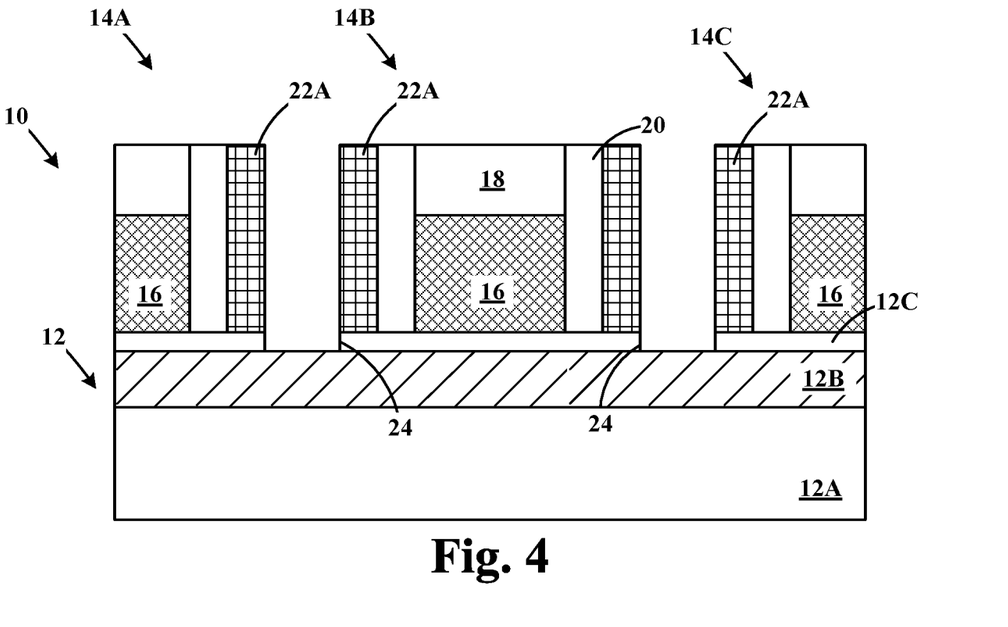

FIG. 4 depicts the product 10 after another anisotropic etching process was performed to remove the exposed portions of the active layer 12C between the sacrificial spacers 22A. This etching process stops on and exposes portions of the buried insulation layer 12B. As a result of this process operation, a plurality of openings 24 is formed in the active layer 12B.

Figure 5:
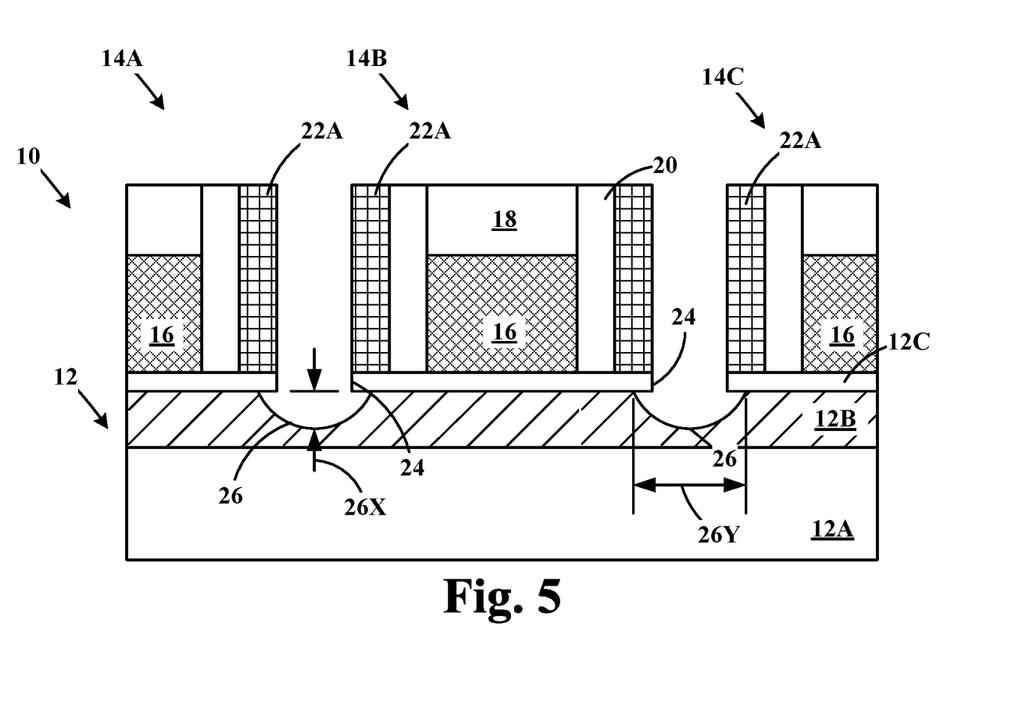

FIG. 5 depicts the product 10 after an isotropic etching process was performed on the buried insulation layer 12B through the openings 24 in the active layer 12C. This etching process results in the formation of a plurality of recesses 26 in the buried insulation layer 12B. The recesses 26 may be of any physical size or shape, and the size and shape of the recesses 26 may vary depending upon the particular application. For example, in the illustrative embodiment shown in FIG. 5, the recesses 26 may have a generally concave cross-sectional configuration with a maximum vertical depth 26X and a lateral width 26Y. In one embodiment, the maximum vertical depth 26X may be about 5% of the thickness of the buried insulation layer. The lateral width 26Y may have a minimum value equal to about the spacing between the sacrificial spacers 22A and a maximum value that is equal to about the spacing between the gate structures 16. In one particularly illustrative example, the lateral width 26Y of the recesses 26 should be large enough such that the outermost portion of the recesses 26 is positioned under at least a portion of the sacrificial spacers 22A (e.g., the recesses 26 extend to a location approximately corresponding to the mid-thickness of the sacrificial spacers 22A). In the example depicted herein, the etching process that is performed to form the recesses 26 is performed with the sacrificial spacers 22A in position. However, in some applications, the sacrificial spacers 22A may be removed prior to performing the etching process to form the recesses 26.

Figure 6:
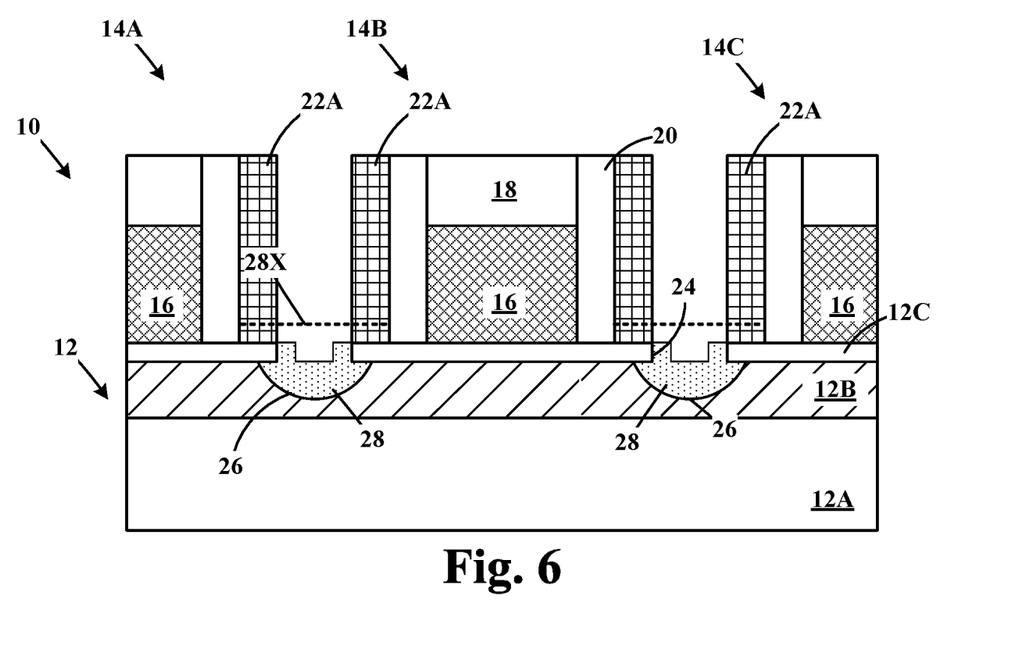

FIG. 6 depicts the product 10 after a first selective source/drain epitaxial deposition (growth) process was performed to form single crystal epi semiconductor material 28 in the recesses 26. The active layer 12C serves as the growth surface during this first epi growth process. The epi semiconductor material 28 may be formed in such a manner that it imparts a desired stress on the channel region of the transistor 14B, i.e., a compressive stress for a PFET device or a tensile stress for an NFET device. In one illustrative process flow, the first epi growth process may be stopped at a point wherein, as depicted, the epi semiconductor material 28 substantially fills the recesses 26 and a fills a significant portion of the openings 24 in the active layer 12C (i.e., wherein an upper surface of portions of the epi material 28 is at approximately the same level as an upper surface of the active layer 12C. The epi semiconductor material 28 may be any type of semiconductor material, e.g., silicon, SiGe, Ge, SiC, graded SiGe or any other stressor material, etc. In one particular process flow, the epi semiconductor material 28 may be substantially un-doped. In other applications, the epi semiconductor material 28 may be doped in situ with an appropriate dopant for the transistor device under construction, i.e., a P-type dopant when the transistors are PFET transistors or an N-type dopant when the transistors are NFET transistors. In cases where the epi material 28 is doped, the dopant concentration may be on the order of about $1e^{15}$-$1e^{22}$ atoms/cm$^3$. In the example depicted herein, the first epi growth process that is performed to form the epi semiconductor material 28 is performed with the sacrificial spacers 22A in position. However, in some applications, the sacrificial spacers 22A may be removed prior to performing the first epi growth process to form the epi semiconductor material 28. With the sacrificial spacers 22A removed, the epi semiconductor 28 would also form on the upper surface of the active layer 12C such that the epi semiconductor material 28 may have an upper surface as depicted by the dashed line 28X. If desired, at least the portion of un-doped epi semiconductor material 28 above the upper surface of the active layer 12C may be doped by performing an ion implantation process.

Figure 7:
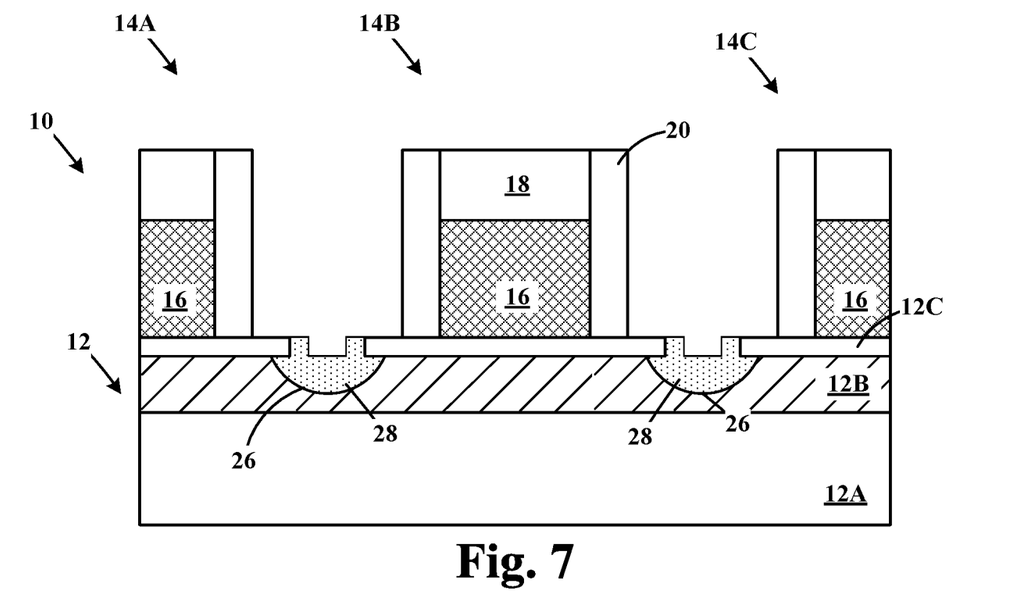

FIG. 7 depicts the product 10 after an etching process was performed to remove the sacrificial spacers 22A relative to the surrounding materials. This process operation exposes portions of the active layer 12C previously covered by the sacrificial spacers 22A.

Figure 8:
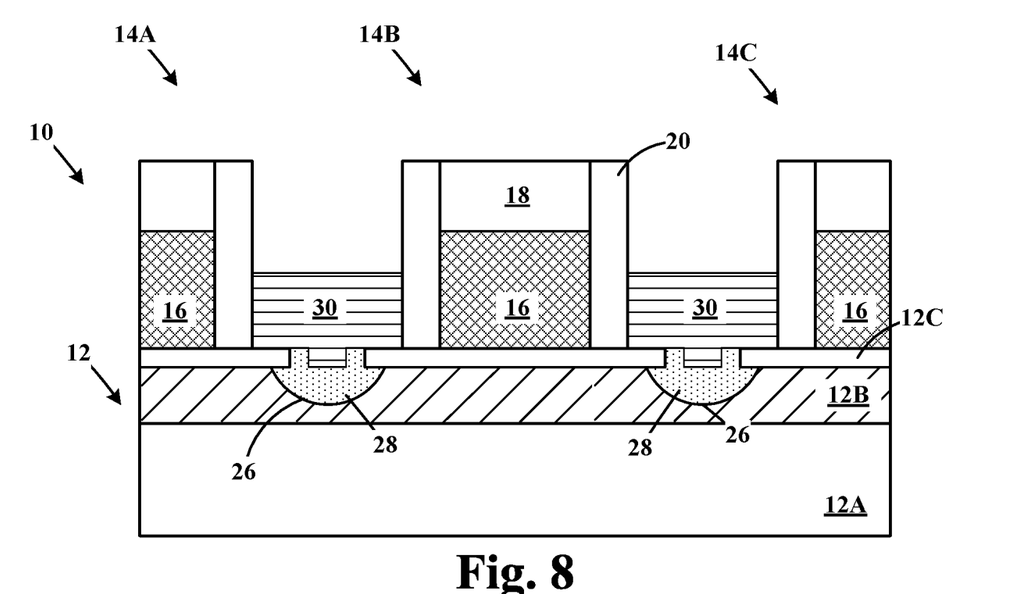

FIG. 8 depicts the product 10 after a second selective source/drain epitaxial deposition (growth) process was performed to form single crystal epi semiconductor material 30 above the epi semiconductor material 28 and the active layer 12C in the source/drain regions of the transistor 14B. The epi semiconductor material 30 may also be formed in such a manner that it imparts a desired stress on the channel region of the transistor 14B, i.e., a compressive stress for a PFET device or a tensile stress for an NFET device. In this particular example, the epi semiconductor material 30 is laterally bounded by the spacers 20 on the transistors 14. The active layer 12C and/or the epi semiconductor material 28 may serve as growth surfaces during this second epi growth process. The amount of the epi semiconductor material 30 that is grown may vary depending upon the particular application. In the depicted example, the second epi growth process may be stopped at a point wherein, as depicted, the upper surface of the epi semiconductor material 30 is above the upper surface of the active layer 12C, e.g., at a level that corresponds to approximately the mid-height of the gate structure 16. However, in other applications, the epi semiconductor material 30 may be grown until the upper surface of the epi semiconductor material 30 is at or above the upper surface of the gate structure 16. The epi semiconductor material 30 may be any type of semiconductor material, e.g., silicon, SiGe, Ge, SiC, graded SiGe, etc. In some applications, the epi semiconductor material 30 may be the same type of semiconductor material as that of the epi semiconductor material 28, but that may not be the case in all applications, i.e., the epi semiconductor material 30 may be a different semiconductor material than that of the epi semiconductor material 28. The epi semiconductor material 30 may be doped in situ or via ion implantation with an appropriate dopant for the transistor device under construction, i.e., a P-type dopant when the transistors are PFET transistors or an N-type dopant when the transistors are NFET transistors. The dopant concentration of the epi semiconductor material 30 may be on the order of about $1e^{15}$-$1e^{22}$ atoms/cm$^3$.

Figure 9:
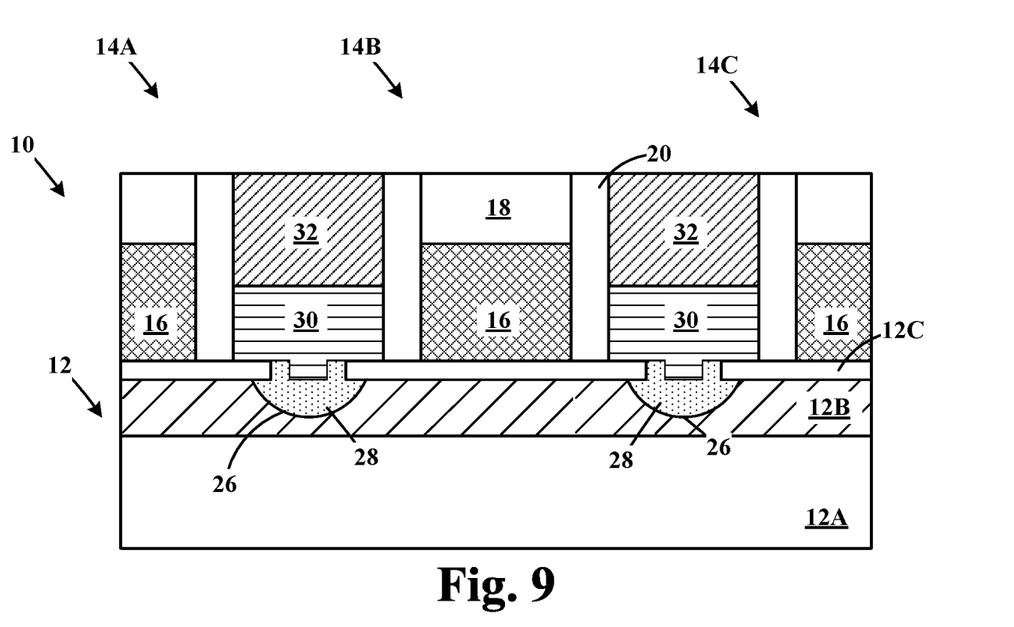

FIG. 9 depicts the product 10 after traditional manufacturing operations were performed to form conductive source/drain contact structures 32 above the epi semiconductor material 30 in each of the source/drain regions of the transistor 14B. The conductive source/drain contact structures 32 may be comprised of a variety of different conductive materials, and they may have a variety of different configurations, e.g., one or more individual contact plugs having a generally square-like shape or cylindrical shape when viewed from above, or a line-type feature that extends for a distance that approximately corresponds to the gate width (into and out of the drawing plane of FIG. 9) of the transistor device 14B. In one illustrative embodiment, the conductive source/drain contact structures 32 may include a so-called "trench silicide" (TS) structure.

Figure 10:
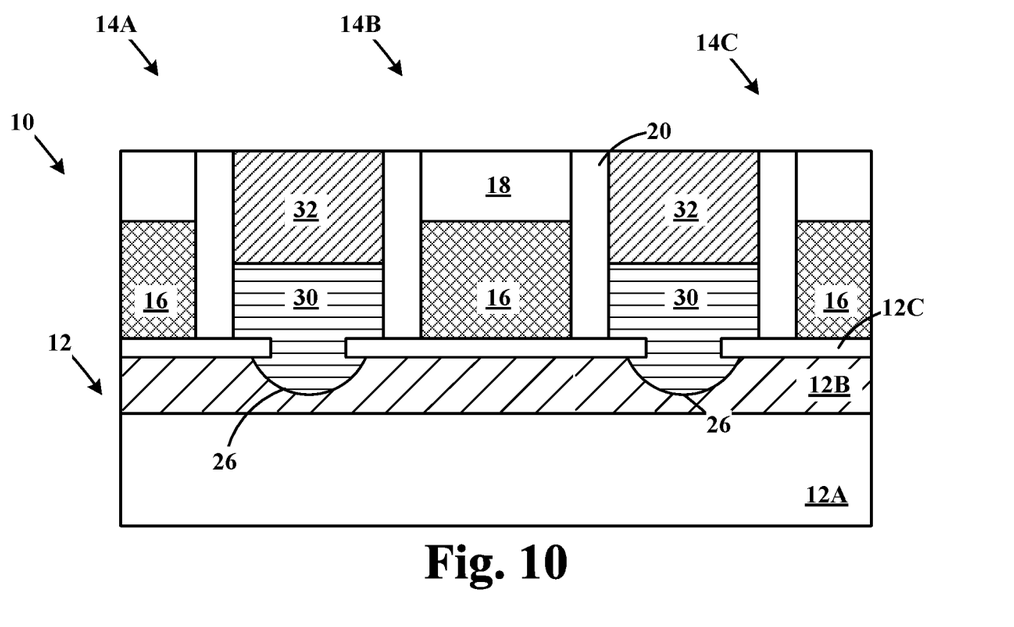

FIG. 10 depicts an alternative process flow disclosed herein. More specifically, in this illustrative process flow, after the recesses 26 were formed in the buried insulation layer 12B (see FIG. 5), the above-described sacrificial spacers 22A were removed so as to expose previously covered portions of the active layer 12C. At that point, the above-described epi semiconductor material 30 was formed in the recesses 26 and above the active layer 12C in the source/drain regions of the transistor 14B. Stated another way, the epi semiconductor material 28 was not formed in this illustrative process flow.

Figure 11:
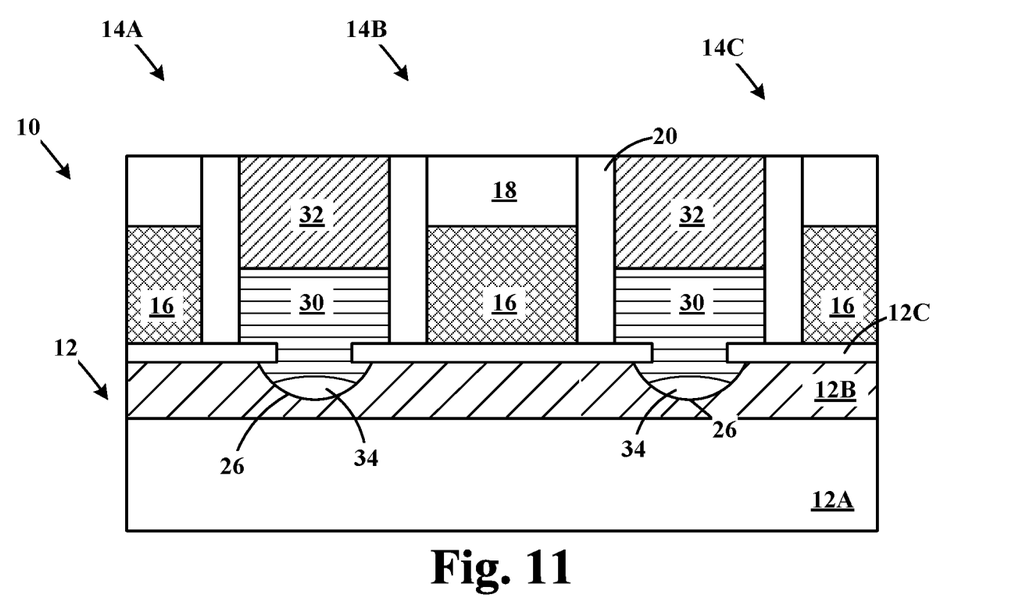

FIG. 11 depicts yet another alternative process flow disclosed herein. This process flow is essentially the same as the one described above with respect to FIG. 10, i.e., the epi semiconductor material 28 is omitted. However, in this illustrative process flow, the epi process that was performed to form the epi semiconductor material 30 was intentionally performed in such a manner so that simplistically depicted air gaps 34 were formed in the recesses 26. In the depicted example, the air gaps 34 are formed between the bottom of the recess 26 and the epi semiconductor material 30. In other situations (not shown), the air gaps 34 may form entirely within the epi semiconductor material 30 that is positioned within the recesses 26. In even other situations, the air gaps 34 may be formed in both locations.

Figure 12:
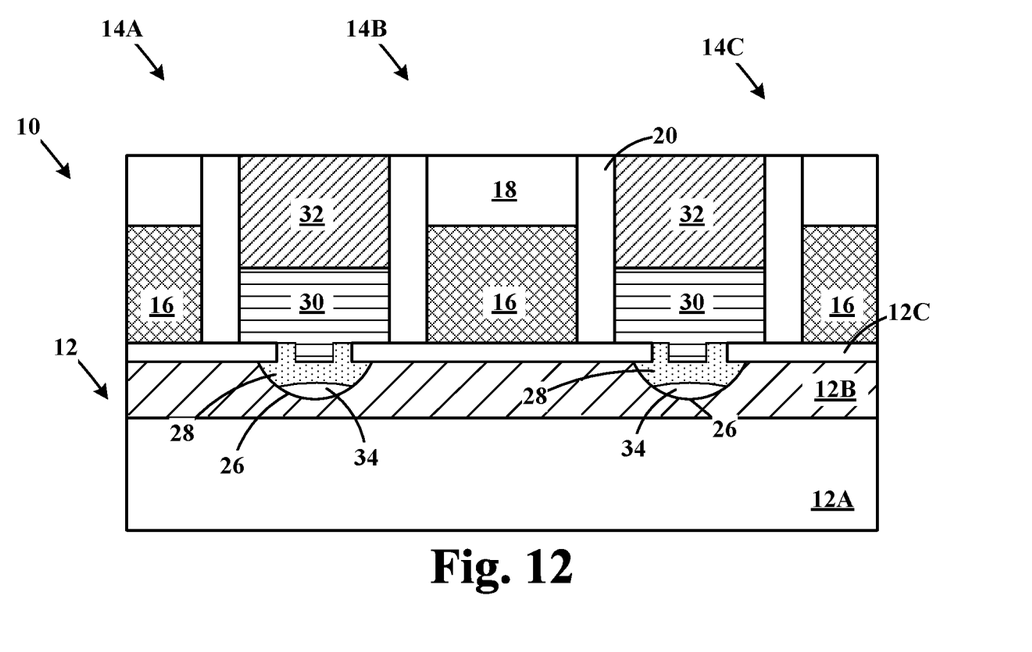

FIG. 12 depicts yet another alternative process flow wherein air gaps 34 were formed in the recesses 26 at the time the epi semiconductor material 28 was formed in the recesses 26. Similar to the process flow described above, in this process flow, the epi process that was performed to form the first epi semiconductor material 28 was intentionally performed in such a manner so that simplistically depicted air gaps 34 were formed in the recesses 26. In the depicted example, the air gaps 34 are formed between the bottom of the recess 26 and the epi semiconductor material 28.

As will be appreciated by those skilled in the art after a complete reading of the present application, as compared to prior art process flows, the formation of the recesses 26 in the buried insulation layer 12B permits the formation of larger volumes of stressed epi semiconductor material adjacent the channel region of the transistor 14B. Also note that, using the methods disclosed herein, at least some of the stressed epi semiconductor material is positioned below the active layer 12C in the source/drain regions of the transistor. By forming this relatively larger volume of stressed epi semiconductor material adjacent the channel region, the amount of relaxation of the stress in the stressed epi semiconductor material due to subsequent manufacturing operations may be reduced or eliminated. Accordingly, the stressed epi semiconductor material (28/30) formed as described herein may still impart the desired level of stress to the channel region and is not significantly adversely affected. The formation of the above-described air gaps 34 may result in reduced parasitic capacitance for the transistor 14B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor formed above a semiconductor-on-insulator (SOI) substrate comprising a bulk semiconductor layer, a buried insulation layer positioned on said bulk semiconductor layer and an active semiconductor layer positioned on said buried insulation layer, said transistor comprising:
   a gate structure, a sidewall spacer and source/drain regions;
   openings extending through said active semiconductor layer of said SOI substrate in said source/drain regions adjacent said sidewall spacer;
   recesses in said buried insulation layer of said SOI substrate in said source/drain regions of said transistor, wherein said recesses extend laterally under a portion of said active semiconductor layer; and
   an epi semiconductor material positioned in at least said recesses in said buried insulation layer, wherein a portion of said buried insulation layer is positioned between said epi semiconductor material positioned in at least said recesses and said bulk semiconductor layer of said SOI substrate, wherein said epi semiconductor material comprises a first substantially un-doped epi semiconductor material that is positioned at least partially within said recesses and extends through at least a portion of said openings in said active semiconductor layer and a second doped epi semiconductor material that is positioned above said first substantially un-doped epi semiconductor material in said source/drain regions and wherein said first substantially un-doped epi semiconductor material and said second doped epi semiconductor material are comprised of different semiconductor materials.

2. The transistor of claim 1, further comprising an air gap positioned within each of said recesses in said buried insulation layer of said SOI substrate, wherein said air gap is positioned below at least a portion of said epi semiconductor material positioned in at least said recesses and wherein a portion of said buried insulation layer of said SOI substrate is positioned between said air gap and an upper surface of said bulk semiconductor layer of said SOI substrate.

3. The transistor of claim 1, wherein said second doped epi semiconductor material has an upper surface that is positioned at a level that is above a level of an upper surface of said active semiconductor layer.

4. The transistor of claim 1, wherein a portion of said second doped epi semiconductor material is positioned on and in contact with said upper surface of said active semiconductor layer.

5. The transistor of claim 1, wherein a portion of said first substantially un-doped epi semiconductor material positioned in at least said recesses in said buried insulation layer contacts and engages a lower surface of said active semiconductor layer.

6. A transistor formed above a semiconductor-on-insulator (SOI) substrate comprising a bulk semiconductor layer, a buried insulation layer positioned on said bulk semiconductor layer and an active semiconductor layer positioned on said buried insulation layer, said transistor comprising:
   a gate structure, a sidewall spacer and source/drain regions;
   openings extending through said active semiconductor layer of said SOI substrate in said source/drain regions adjacent said sidewall spacer;
   recesses in said buried insulation layer of said SOI substrate in said source/drain regions of said transistor, wherein said recesses extend laterally under a portion of said active semiconductor layer;

a first substantially un-doped epi semiconductor material that substantially fills said recesses, wherein a portion of said buried insulation layer is positioned between said first substantially un-doped epi semiconductor material positioned in at least said recesses and said bulk semiconductor layer of said SOI substrate; and a second doped epi semiconductor material that is positioned on said first substantially un-doped epi semiconductor material in said source/drain regions, wherein said second doped epi semiconductor material has an upper surface that is positioned at a level that is above a level of an upper surface of said active semiconductor layer, wherein said first substantially un-doped epi semiconductor material and said second doped epi semiconductor material are comprised of different semiconductor materials.

7. The transistor of claim 6, wherein a portion of said first substantially un-doped epi semiconductor material positioned in at least said recesses in said buried insulation layer contacts and engages a lower surface of said active semiconductor layer.

8. The transistor of claim 6, further comprising an air gap positioned within said buried insulation layer of said SOI substrate below each of said recesses in said buried insulation layer of said SOI substrate, wherein said air gap is positioned below at least a portion of said first substantially un-doped epi semiconductor material positioned in at least said recesses and wherein a portion of said buried insulation layer of said SOI substrate is positioned between said air gap and an upper surface of said bulk semiconductor layer of said SOI substrate.

9. The transistor of claim 6, wherein a portion of said second doped epi semiconductor material is positioned on and in contact with said upper surface of said active semiconductor layer.

10. A transistor formed above a semiconductor-on-insulator (SOI) substrate comprising a bulk semiconductor layer, a buried insulation layer positioned on the bulk semiconductor layer and an active semiconductor layer positioned on the buried insulation layer, the transistor comprising:

a gate structure, a sidewall spacer and source/drain regions;

openings extending through the active semiconductor layer of the SOI substrate in the source/drain regions adjacent the sidewall spacer;

recesses in the buried insulation layer of the SOI substrate in the source/drain regions of the transistor, wherein the recesses extend laterally under a portion of the active semiconductor layer; and an epi semiconductor material positioned in at least the recesses in the buried insulation layer, wherein a portion of the buried insulation layer is positioned between the epi semiconductor material positioned in at least the recesses and the bulk semiconductor layer of the SOI substrate, wherein the epi semiconductor material comprises a first substantially un-doped epi semiconductor material that is positioned at least partially within the recesses and a second doped epi semiconductor material that is positioned above the first substantially un-doped epi semiconductor material in the source/drain regions and wherein the first substantially un-doped epi semiconductor material and the second doped epi semiconductor material are comprised of different semiconductor materials, wherein a portion of the first substantially un-doped epi semiconductor material positioned in at least the recesses in the buried insulation layer contacts and engages a lower surface of the active semiconductor layer.

11. The transistor of claim 10, further comprising an air gap positioned within each of the recesses in the buried insulation layer of the SOI substrate, wherein the air gap is positioned below at least a portion of the epi semiconductor material positioned in at least the recesses and wherein a portion of the buried insulation layer of the SOI substrate is positioned between the air gap and an upper surface of the bulk semiconductor layer of the SOI substrate.

12. The transistor of claim 10, wherein the second doped epi semiconductor material has an upper surface that is positioned at a level that is above a level of an upper surface of the active semiconductor layer.

13. The transistor of claim 10, wherein a portion of the second doped epi semiconductor material is positioned on and in contact with the upper surface of the active semiconductor layer.

* * * * *